United States Patent [19]

Hahn

[11] Patent Number: 4,691,971
[45] Date of Patent: Sep. 8, 1987

[54] CONNECTOR WITH COMPLIANT RETAINER

[75] Inventor: Marlyn E. Hahn, York, Pa.

[73] Assignee: E. I. Du Pont de Nemours and Company, Wilmington, Del.

[21] Appl. No.: 910,456

[22] Filed: Sep. 17, 1986

[51] Int. Cl.⁴ .............................................. H05K 1/00
[52] U.S. Cl. ....................................... 439/78; 24/453;
   439/82; 439/84; 439/603
[58] Field of Search ................... 339/59, 61 R, 61 L,
   339/61 M, 63, 17 R, 17 C, 17 LC, 17 LM, 17
   M, 91 R, 91 P, 75, 198 R, 198 K, 198 P, 217,
   219 R, 220, 221; 248/73, 231.9; 24/453, 297,
   305, 326

[56] References Cited

U.S. PATENT DOCUMENTS

| 2,909,957 | 10/1959 | Rapata | 248/73 |
| 3,271,059 | 9/1966 | Pearson | 24/453 |
| 3,902,153 | 8/1975 | Narozny | 339/214 R |
| 4,050,772 | 9/1977 | Birnholz et al. | 339/220 R |
| 4,122,583 | 10/1978 | Grittner et al. | 24/297 |
| 4,435,031 | 3/1984 | Black et al. | 339/17 C |
| 4,457,570 | 7/1984 | Bogese, III | 339/17 C |

FOREIGN PATENT DOCUMENTS 1040322 10/1953 France .

Primary Examiner—Gil Weidenfeld
Assistant Examiner—David Pirlot

[57] ABSTRACT

A cross-shaped retainer post with an oval longitudinal base which may break through when the ribs of the cross are stressed upon insertion into a locating hole.

2 Claims, 3 Drawing Figures

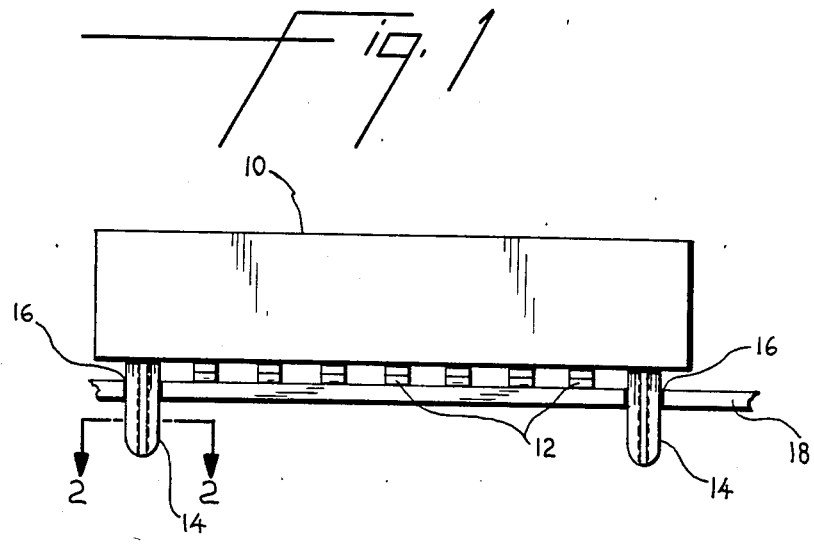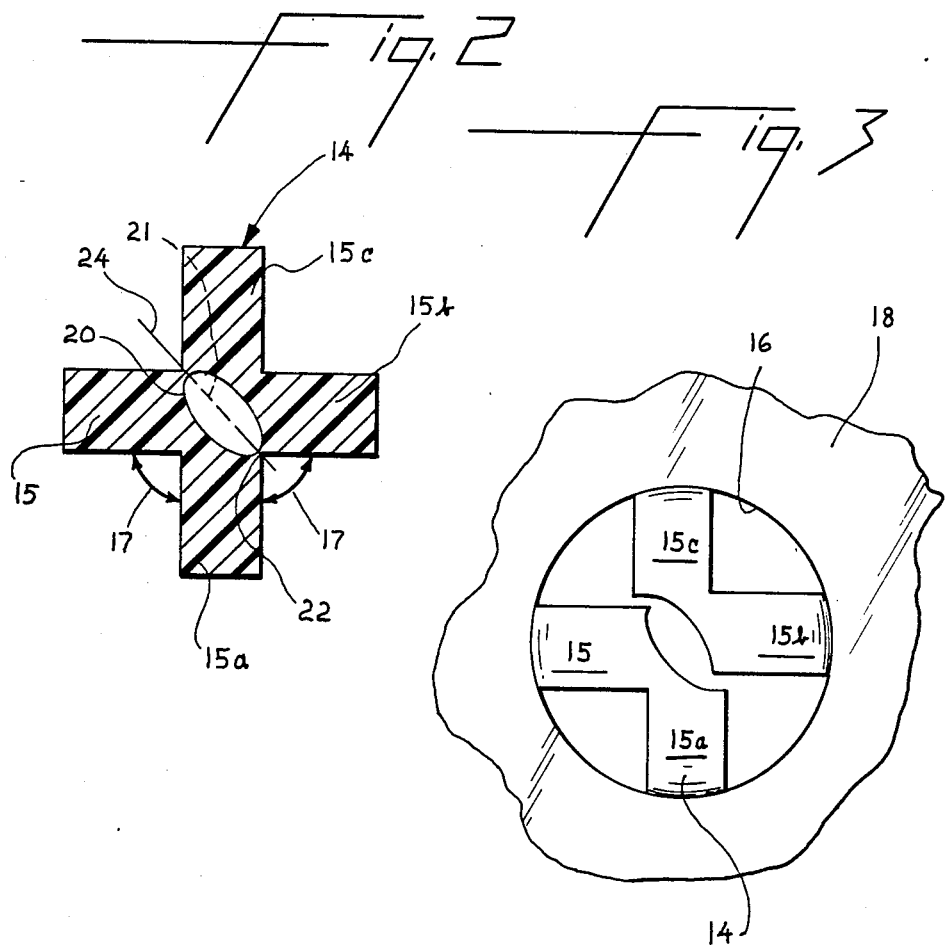

CONNECTOR WITH COMPLIANT RETAINER

BACKGROUND OF THE INVENTION

This invention relates to connectors for printed wiring boards and more particularly it relates to means for locating and holding the connector to the wiring board until soldered.

The mechanics of holding a card connector housing to a printed wiring board (PWB) until it is soldered, as known in the prior art, involves either mechanical fasteners (screws, rivits, etc.), weighted plates placed on top of components and removed after soldering, or posts integral with the housing. Molded posts which are part of the housing are particularly suited for surface mount connectors. The posts provide a means for accurately locating the connector legs to the PWB solder pad and holding the connector in place during the soldering process by engaging holes located in the PWB. There is an interference fit between the posts and the holes. With known post designs of various shapes the interference fit results in material being scraped from the post as it is inserted into the locating hole. These scrapings present assembly problems by preventing contact between the connector and PWB.

SUMMARY OF THE INVENTION

This invention overcomes the limitations noted above with respect to prior art devices for locating and holding connectors to PWB by providing a post that extends from the connector housing for engaging, with an interference fit, a hole in a PWB. The post has a plurality of ribs extending outwardly from the post at locations around the post and an elongated longitudinal bore having its major axis aligned with directly opposed junctures of adjoining ribs. The bore is sized so that the wall formed between said directly opposed junctures and the bore is frangible when said post is inserted in said hole. This forms two separated legs from the integral post allowing the ribs to flex to conform easily to the hole size or location without scraping material from the post and to reduce insertion forces.

BRIEF DESCRIPTION OF THE DRAWINGS

FIG. 1 is a front elevation view showing a connector housing with locating posts extending downwardly from the housing through locating holes in a PWB.

FIG. 2 is an enlarged cross-sectional view of a post of FIG. 1 taken along the line 2—2 before insertion into a location hole of a PWB.

FIG. 3 is a plan view of a post inserted into a locating hole of a PWB with an interference fit.

DETAILED DESCRIPTION OF THE PREFERRED EMBODIMENT

Referring to the drawing, the embodiment chosen for purposes of illustration includes a connector housing 10 having terminals 12 and locating posts 14 fastened to and extending downwardly from the housing. The posts 14 are shown inserted through locating holes 16 of PWB 18. The posts 14 are sized for an interference fit with holes 16 and are preferably molded as an integral part of the housing 10.

Referring particularly to FIG. 2 each post 14 is seen to have a plurality of ribs numbered 15, 15a, 15b, and 15c located around the post at and angle 17 of about ninety degrees to each other. There is an elongated longitudinal bore 20 extending through post 14. The bore 20 is shown in the shape of an oval with its major axis 21 aligned with directly opposed junctures 22,24 of adjoining ribs 15, 15a, 15b, and 15c. The bore is sized to provide a frangible wall at junctures 22,24 which separates when the post 14 is inserted in hole 16 of PWB 18 as best shown in FIG. 3. The bore 20 breaks through the junctures of ribs 15, 15a and 15b, 15c allowing the ribs to flex. The cross configuration shown provides four narrow surfaces which easily conform to hole size or location without scraping the post or ribs as the case may be.

I claim:

1. An apparatus for locating and holding a connector housing to a printed wiring board having locating holes therein, said apparatus comprising: a post extending from said housing for engaging said holes with an interference fit to locate the housing with respect to said printed wiring board, said post having a plurality of ribs extending outwardly from the post at locations around the post and an elongated longitudinal bore having its major axis aligned with directly opposed junctures of adjoining ribs and sized to provide a frangible juncture which separates when said post is inserted in a locating hole.

2. The apparatus of claim 1, said post having four ribs located at ninety degrees to each other, said elongated longitudinal bore being oval shaped having its major axis in alignment with opposed junctures of adjoining ribs.

* * * * *